United States Patent
Fukaishi et al.

(10) Patent No.: US 7,352,067 B2
(45) Date of Patent: Apr. 1, 2008

(54) STACKED SEMICONDUCTOR DEVICE

(75) Inventors: Muneo Fukaishi, Tokyo (JP); Hideaki Saito, Tokyo (JP); Yasuhiko Hagihara, Tokyo (JP); Masayuki Mizuno, Tokyo (JP); Hiroaki Ikeda, Tokyo (JP); Kayoko Shibata, Tokyo (JP)

(73) Assignees: NEC Corporation (JP); Elpida Memory, Inc. (JP)

( * ) Notice: Subject to any disclaimer, the term of this patent is extended or adjusted under 35 U.S.C. 154(b) by 61 days.

(21) Appl. No.: 11/166,229

(22) Filed: Jun. 27, 2005

(65) Prior Publication Data

US 2006/0001176 A1  Jan. 5, 2006

(30) Foreign Application Priority Data

Jun. 30, 2004 (JP) ............................. 2004-192763

(51) Int. Cl.
*H01L 29/40* (2006.01)

(52) U.S. Cl. .................................................... 257/777

(58) Field of Classification Search ................ 257/686, 257/777, 700, 698, 773–774, E23.499
See application file for complete search history.

(56) References Cited

U.S. PATENT DOCUMENTS 6,034,438 A * 3/2000 Petersen ...................... 257/786
6,365,975 B1 * 4/2002 DiStefano et al. ........... 257/777
2003/0085461 A1 * 5/2003 Sakiyama et al. ........... 257/700
2006/0001179 A1 * 1/2006 Fukase et al. ............... 257/778

FOREIGN PATENT DOCUMENTS

| JP | 58-144871 U | 9/1983 |
|---|---|---|
| JP | 61-131497 A | 6/1986 |
| JP | 04-196263 | 7/1992 |
| JP | 5-243535 A | 9/1993 |
| JP | 2000-311941 | 11/2000 |
| JP | 2002-026283 | 1/2002 |
| JP | 2002-141436 | 5/2002 |
| JP | 2003-086589 | 3/2003 |
| JP | 2004-152812 A | 5/2004 |

OTHER PUBLICATIONS

Kenji Takahashi, et al.; "Current Status of Research and Development for Three-Dimensional Chip Stack Technology"; Jpn. J. Appl. Phys.; vol. 40; 2001; pp. 3032-3037.

* cited by examiner

*Primary Examiner*—Nathan W Ha
(74) *Attorney, Agent, or Firm*—Dickstein, Shapiro, LLP.

(57) ABSTRACT

A stacked semiconductor device includes a plurality of semiconductor chips and a conductive path extending through at least one of the semiconductor chips. The semiconductor chips are stacked together. The semiconductor chips are electrically connected by the conductive path, and the conductive path has a plurality of through-connections extending through the corresponding semiconductor chip.

15 Claims, 11 Drawing Sheets

STACKED SEMICONDUCTOR DEVICE

BACKGROUND OF THE INVENTION

1. Field of the Invention

The present invention relates to a semiconductor device such as a semiconductor integrated circuit device or the like, and more particularly to a semiconductor device comprising a plurality of stacked semiconductor chips.

2. Description of the Related Art

Semiconductor integrated circuit devices have an integration density increased as the size of transistors that make up semiconductor integrated circuit devices decreases. Circuits for achieving many functions are installed on semiconductor integrated circuit devices each comprising a single semiconductor chip. Semiconductor memory devices, regardless of the types of memory circuits such as DRAMs (Dynamic Random Access Memories), SRAMs (Static Random Access Memories), or the like, also have a storage capacity increased as the size of transistors that make up semiconductor memory devices decreases.

In recent years, however, there have been growing demands in the art for more functionality and storage capability for semiconductor devices such as semiconductor integrated circuit devices and semiconductor memory devices than possible with the reduction of the size of transistors. It is understood that there are certain limitations on the efforts to reduce the size of transistors used in semiconductor devices. In view of the demands and the limitations, the development of new technologies has been sought for increasing the integration density of semiconductor devices. One of the technologies that have attracted attention in the art is a stacked semiconductor device, also referred to as a three-dimensional semiconductor device, comprising a plurality of stacked semiconductor chips. The stacked semiconductor chips provide a large-scale integrated circuit without the need for an increased apparent two-dimensional chip area or floor size.

Japanese laid-open patent publication No. H04-196263 (JP, 4-196263A) discloses a semiconductor device having a memory circuit integrated in a chip stacked on a semiconductor integrated circuit device. Japanese laid-open patent publication No. 2002-26283 (JP, P2002-26283A) discloses a multilayer memory device structure comprising a plurality of memory cell arrays disposed as multiple layers for an increased storage capacity.

If a plurality of semiconductor chips are multi-layered into a semiconductor device, then wiring between the stacked semiconductor chips is required in addition to wiring within each of the semiconductor chips. In conventional semiconductor devices having a plurality of semiconductor chips two-dimensionally arranged, wire bonding is often used for interconnections between the semiconductor chips. However, if wire bonding is applied to stacked semiconductor devices, then since wire bonding is a technology for interconnecting pads on the surface of a semiconductor chip, the following problems tend to occur:

(1) Because a pad provided on the surface of a chip needs a certain pad area such as 100 µm squared, the number of bonding wires that can be used on the chip is limited;

(2) Since pads disposed on the surfaces of stacked semiconductor chips are required to be positioned on outer edges of the stacked semiconductor chips so that they can be connected from outside of the chips, pads for bonding wires are not accessible if the stacked semiconductor chips are identical in shape to each other.

One solution to the above problems is through-connection that is provided through a plurality of semiconductor chips. Takahashi, et al. (K. Takahashi et al., Japanese Journal of Applied Physics, 40, 3032-3037 (2001)), proposed a silicon semiconductor chip having transistors formed thereon is thinned to a thickness of 50 µm, through-vias each having a size of 10 µm squared are formed in the silicon semiconductor chip, and plugs of metal are placed in the through-vias to provide through-connection for inter-chip interconnections. The through-connection allows inter-chip interconnections to be positioned two-dimensionally in the planes of chips, and makes it possible to provide several hundred inter-chip interconnections. In addition, since inter-chip interconnections extend through chips, a plurality of semiconductor chips that are identically shaped and sized can be stacked as a plurality of layers.

If a plurality of semiconductor chips are stacked according to the above technology, then it is possible to stack not only memory circuits, but also logic circuits and analog circuits, so that semiconductor memory devices can have an increased storage capacity and semiconductor integrated circuits can have many functions.

FIG. 1 shows an example of a conventional stacked semiconductor device which employs through-connection. In FIG. 1, three semiconductor chips 1801, 1803, 1806 are stacked. Second semiconductor chip 1803 and third semiconductor chip 1806 are stacked, successively in the order named, on first semiconductor chip 1801. First functional circuit 1802 disposed on first semiconductor chip 1801, second functional circuit 1805 disposed on second semiconductor chip 1803, and third functional circuit 1808 disposed on third semiconductor chip 1806 are electrically connected by through-connection 1804 extending through second semiconductor chip 1803 and through-connection 1807 extending through third semiconductor chip 1806.

For forming a through-connection through a semiconductor chip, it is necessary to form holes having a high aspect ratio such as 5:1, in the semiconductor substrate such as a silicon substrate, apply an insulating layer to inner side walls of the holes, and fill the holes with an interconnection material such as metal or polysilicon. Because of these steps, it is generally difficult to increase the accuracy with which to form through-connections, and hence the yield of through-connections has been low. If three or more semiconductor chips are stacked, then since through-connections need to be positioned accurately between the stacked semiconductor chips, the yield of products made up of stacked semiconductor chips is also low. In addition, when the number of stacked semiconductor chips is increased, e.g., three or four semiconductor chips are stacked, if even one of the stacked semiconductor chips suffers a through-connection failure, then the entire stacked semiconductor device becomes defective. Since the effect that a through-connection failure on one semiconductor chip has on a defect of a stacked semiconductor device increases depending on the number of stacked semiconductor chips, the fraction defective of stacked semiconductor devices increases as the number of stacked semiconductor chips increases.

SUMMARY OF THE INVENTION

It is therefore an object of the present invention to provide a stacked semiconductor device which can be manufactured at a high yield regardless of through-connection failures.

The above object can be accomplished by a stacked semiconductor device comprising a plurality of semiconductor chips, the semiconductor chips being stacked together, and a conductive path extending through at least one of the semiconductor chips, wherein the semiconductor chips are electrically connected by the conductive path, and each conductive path has a plurality of through-connections extending through the corresponding semiconductor chip.

According to the present invention, the stacked semiconductor device preferably has a switch circuit connected to the through-connections for selectively using a normal one of the through-connections as a signal path. Preferably, the switch circuit separates a faulty one of the through-connections. The switch circuit is preferably associated with each of the semiconductor chips. The switch circuit may comprise, for example, a tristate circuit.

According to the present invention, the through-connections are generally classified into primary through-connections and backup through-connections. Preferably, the switch circuit switches each of the primary through-connections to either one of the backup through-connections. With this arrangement, the number of the primary through-connections and the number of the backup through-connections may be equal to each other.

Each of the backup through-connections may be shared by a plurality of the primary through-connections.

According to the present invention, provision of a plurality of through-connections, which include, for example, backup through-connections that provide a redundant structure for primary through-connections, are effective to reduce the fraction defective of the stacked semiconductor device that is made up of a plurality of semiconductor chips, due to a failure of the through-connections. Therefore, the yield of stacked semiconductor devices is prevented from being lowered, but can be increased.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
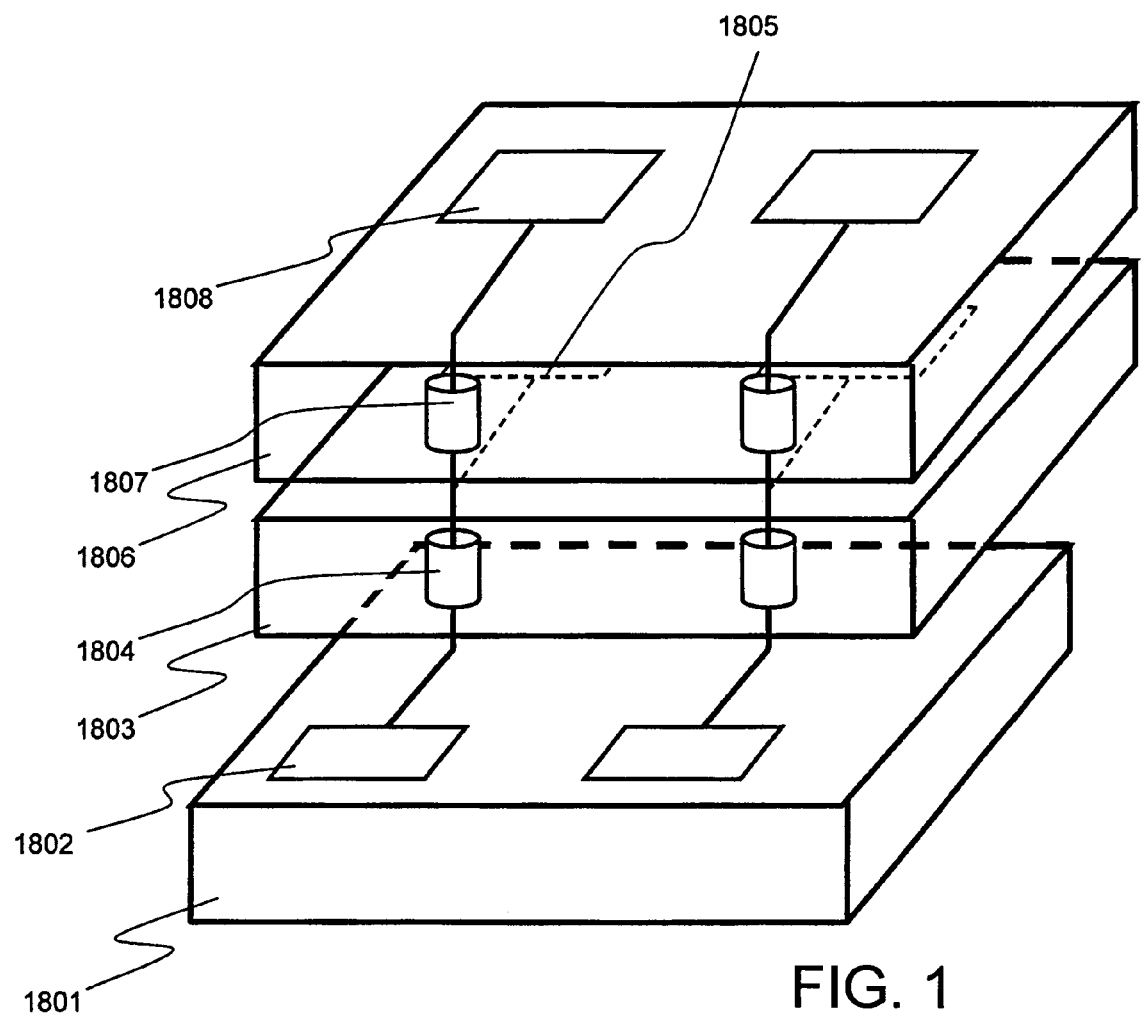
FIG. 1 is a schematic perspective view of a conventional stacked semiconductor device.
Figure 2:
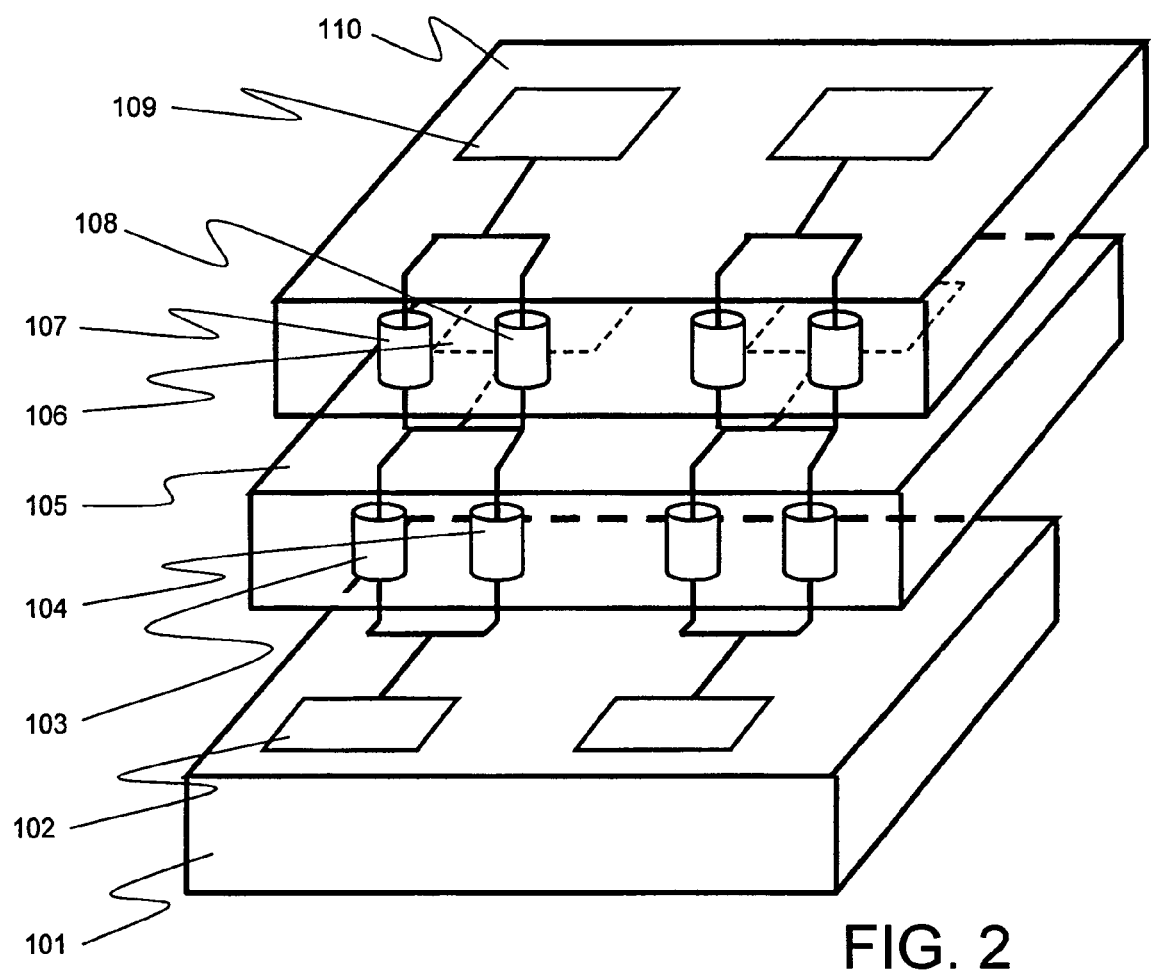
FIG. 2 is a schematic perspective view of a stacked semiconductor device according to an embodiment of the present invention.

A stacked semiconductor device according to an embodiment of the present invention as shown in FIG. 2 has three semiconductor chips 101, 105, 110. Second semiconductor chip 105 and third semiconductor chip 110 are stacked, successively in the order named, on first semiconductor chip 101.

First functional circuit 102 is disposed on first semiconductor chip 101, second functional circuit 106 on second semiconductor chip 105, and third functional circuit 109 on third semiconductor chip 110. These functional circuits 102, 106, 109 are electrically connected by through-connection 103 extending through second semiconductor chip 105 and through-connection 107 extending through third semiconductor chip 110. Backup through-connection 104 extends through second semiconductor chip 105 parallel to through-connection 103, and backup through-connection 108 extends through third semiconductor chip 110 parallel to through-connection 107. Backup through-connections 104, 108 are connected parallel to primary through-connections 103, 107, respectively, so that even if primary through-connections 103, 107 fail, the connection between semiconductor chips 101, 105, 110 does not fail, and functional circuits 102, 106, 109 remain connected to each other. Therefore, backup through-connections 104, 108 are provided as redundant backups for primary through-connections 103, 107 to relieve or remedy a failure of primary through-connections 103, 107. Generally, since a most common fault mode for through-connections is disconnections, the redundancy backups according to the present embodiment are effective to relieve connection failures or disconnections highly efficiently.

The backup through-connections should preferably be formed as having the same electric characteristics as the primary through-connections. Specifically, the backup through-connections should preferably be formed simultaneously in the same size according to the same process as the primary through-connections.

In the embodiment shown in FIG. 2, the backup through-connections are associated in one-to-one correspondence with the primary through-connections. However, more than one backup through-connections may be associated with each primary through-connection, so that no connection failure will be caused in the event of a failure of one of the backup through-connections. Stated otherwise, more than one backup through-connections may be connected parallel to each primary through-connection to reduce the probability of connection failures between semiconductor chips of a stacked semiconductor device.

In FIG. 2, three semiconductor chips 101, 105, 110 are shown as being positionally staggered with respect to each other for the purpose of illustrating the effectiveness of the backup through-connections. For reducing the apparent chip size of the stacked semiconductor device, it is preferable to stack the semiconductor chips accurately in vertical alignment with each other. Even though the semiconductor chips are stacked accurately in vertical alignment with each other, the stacked semiconductor device offers the same advantages as described above.

Figure 3:
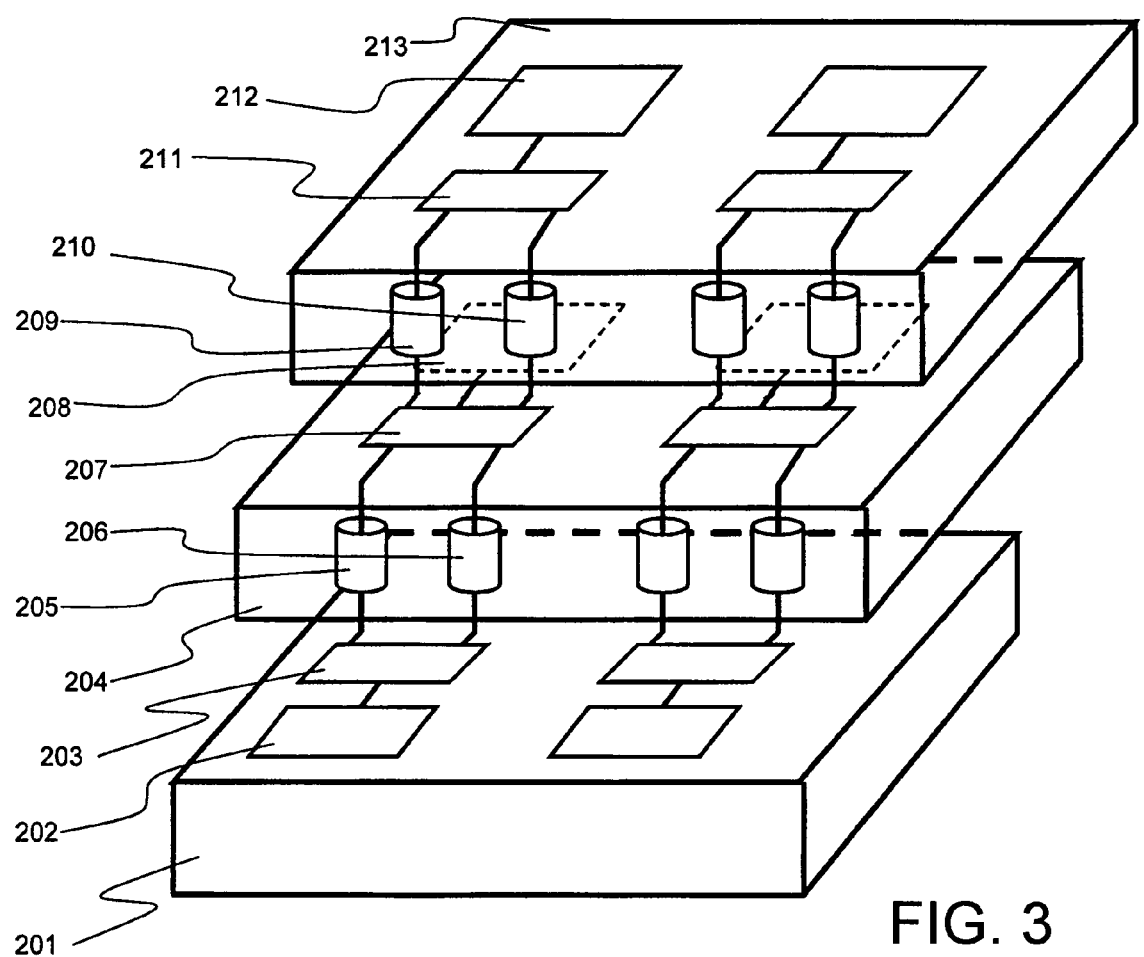
FIG. 3 is a schematic perspective view of a stacked semiconductor device with selector switch circuits connected to opposite ends of through-connections.

FIG. 3 shows in schematic perspective a stacked semiconductor device according to another embodiment of the present invention. The stacked semiconductor device shown in FIG. 3 has switch circuits connected to opposite ends of primary through-connections and backup through-connections corresponding to the primary through-connections, for selecting primary through-connections and backup through-connections. As shown in FIG. 3, the stacked semiconductor device has three semiconductor chips 201, 204, 213. Second semiconductor chip 204 and third semiconductor chip 213 are stacked, successively in the order named, on first semiconductor chip 201. In FIG. 3, three semiconductor chips 201, 204, 213 are also shown as being positionally staggered with respect to each other. Actually, however, semiconductor chips 201, 204, 213 are stacked in vertical alignment with each other. First functional circuit 202 and first switch circuit 203 are disposed on first semiconductor chip 201, second functional circuit 208 and second switch circuit 207 on second semiconductor chip 204, and third functional circuit 212 and third switch circuit 211 on third semiconductor chip 213.

Through-connection 205 extending through second semiconductor chip 204 and backup through-connection 206 extending through second semiconductor chip 204 parallel to through-connection 205 electrically interconnect first functional circuit 202 on first semiconductor chip 201 and second functional circuit 207 on second semiconductor chip 204 through first switch circuit 203 on first semiconductor chip 201 and second switch circuit 207 on second semiconductor chip 204. Switch circuits 203, 207 provided at the opposite ends of through-connection 205 and backup through-connection 206 serve to detect a fault of through-connection 205 and backup through-connection 206 and to connect functional circuits 202, 208 to each other by bypassing the faulty through-connection. Similarly, through-connection 209 extending through third semiconductor chip 213 and backup through-connection 210 extending through third semiconductor chip 213 parallel to through-connection 209 electrically interconnect second functional circuit 208 and third functional circuit 212 through second switch circuit 207 and third switch circuit 211.

According to the embodiment shown in FIG. 3, as described above, switch circuits are connected to the opposite ends of a through-connection, and in the event of a failure of the through-connection, the switch circuits select a backup through-connection to interconnect functional circuits, and disconnects the faulty through-connection from the functional circuits. Therefore, the functional circuits remain connected regardless of the fault mode of the faulty through-connection. With the stacked semiconductor device where the backup through-connections are connected parallel to the through-connections as shown in FIG. 2, when a through-connection suffers an open failure, i.e., when it is disconnected, the failure can be eliminated and the functional circuits can be kept connected. However, when a through-connection is short-circuited to the semiconductor substrate of a semiconductor chip, i.e., when it suffers a short-circuiting failure, the faulty through-connection is connected to the same potential as the semiconductor substrate, preventing the functional circuits from remaining accurately connected. With the stacked semiconductor device shown in FIG. 3, however, a faulty through-connection can electrically be separated from the functional circuits by the switch circuits connected to the opposite ends of the through-connection. Therefore, irrespective of whether the faulty through-connection suffers an open failure or a short-circuiting failure, the failure can be relieved or remedied and the functional circuits remain reliably connected.

A faulty through-connection can be detected by monitoring the amount of current flowing through the through-connection or monitoring the transfer speed at which a signal that can be transmitted between through-connections is transferred. Switch circuits may switch between a through-connection and a backup through-connection depending on the monitored result.

Figure 4:
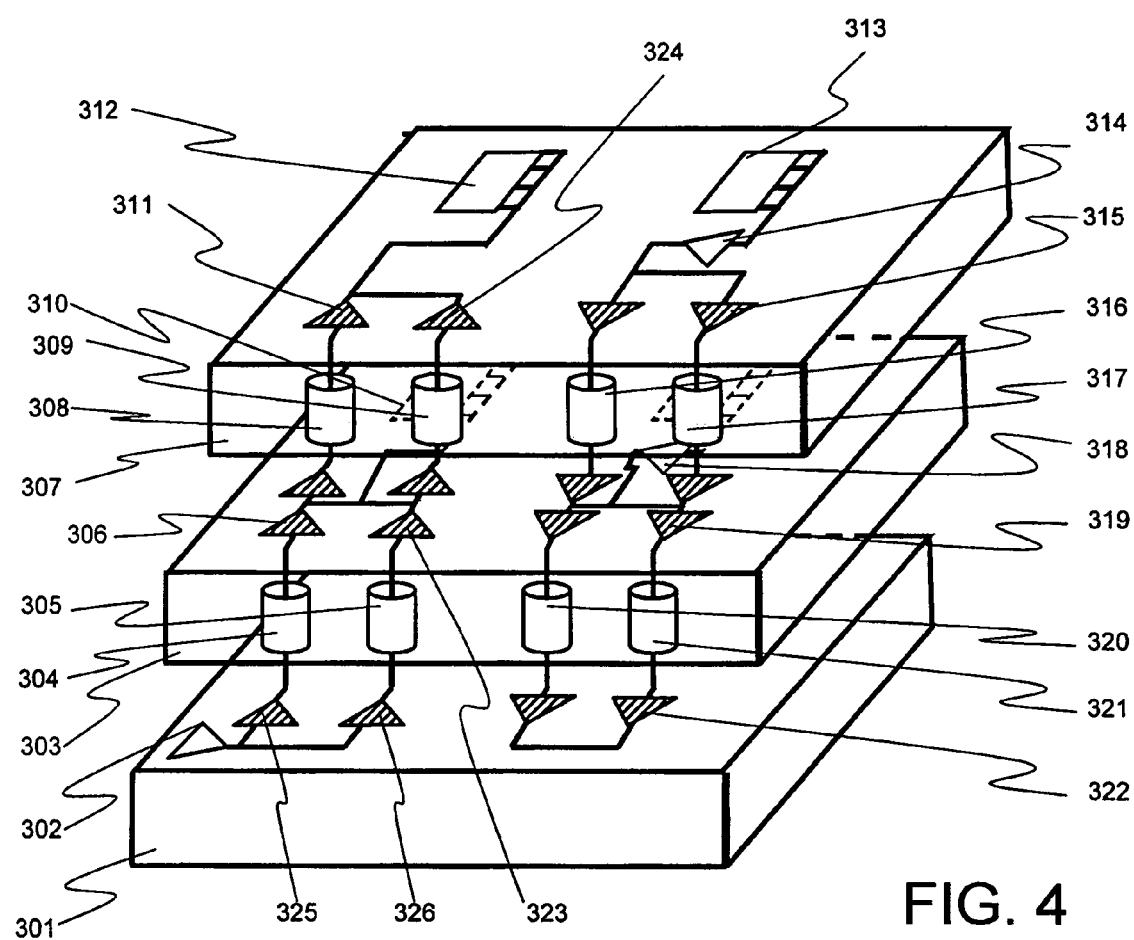
FIG. 4 is a schematic perspective view of a stacked semiconductor device in which a signal is transmitted unidirectionally via through-connections.

FIG. 4 shows a stacked semiconductor device in which a signal is transmitted unidirectionally via through-connections, based on the structure wherein a faulty through-connection is separated by switch circuits as shown in FIG. 3. As shown in FIG. 4, the stacked semiconductor device has three semiconductor chips 301, 303, 307. Second semiconductor chip 303 and third semiconductor chip 307 are stacked, successively in the order named, on first semiconductor chip 301. In FIG. 4, three semiconductor chips 301, 303, 307 are also shown as being positionally staggered with respect to each other. Actually, however, semiconductor chips 301, 303, 307 are stacked in vertical alignment with each other.

A signal outputted from first transmitting circuit 302 disposed on first semiconductor chip 301 is transmitted through tristate receiving circuits 325, 326 on first semiconductor chip 301 and through-connection 304 and backup through-connection 305 which extend through second semiconductor chip 303, and is received by tristate receiving circuits 306, 323 disposed on second semiconductor chip 303. Tristate receiving circuit 325 has an output terminal connected to an end of through-connection 304, and the other end through-connection 304 is connected to an input terminal of tristate receiving circuit 306. Similarly, tristate receiving circuit 326 has an output terminal connected through backup through-connection 305 to an input terminal of tristate receiving circuit 323. Tristate receiving circuits 325, 326 jointly makeup first switch circuit 203 of the stacked semiconductor device shown in FIG. 3, and tristate receiving circuits 306, 323 jointly makeup second switch circuit 207 of the stacked semiconductor device shown in FIG. 3.

Figure 5:
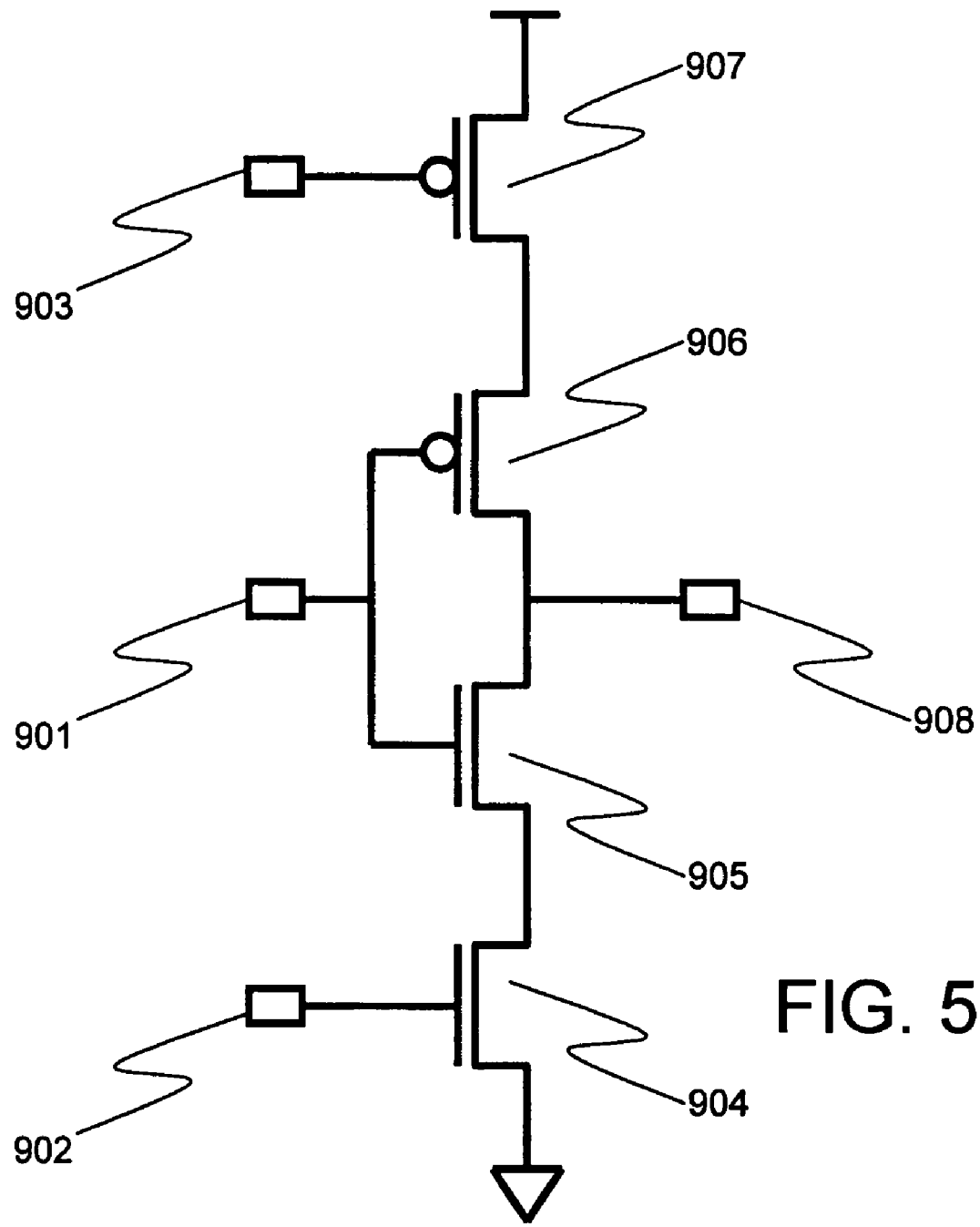
FIG. 5 is a circuit diagram of an example of a tristate circuit.

Each of the tristate receiving circuits is a receiving circuit capable of selecting whether an input signal is to be received or not. An example of such a tristate receiving circuit is shown in FIG. 5. In FIG. 5, the tristate receiving circuit has NMOS (N-channel MOS) transistor 904, NMOS transistor 905, PMOS (P-channel MOS) transistor 906, and PMOS transistor 907 which are connected successively in the order named from ground to a power supply potential, with their channels connected successively in series. Transistor 904 has a gate connected to first selection terminal 902, and Transistor 907 has a gate connected to second selection terminal 903. Transistors 905, 906 have respective gates connected in common to input terminal 901. Transistors 905, 906 have respective drains connected in common to output terminal 908. By controlling two selection terminals 902, 903, the tristate receiving circuit shown in FIG. 5 can select whether a signal applied to input terminal 901 is transmitted to output terminal 908 or not. In addition, when selection terminals 902, 903 are not selected, input terminal 901 and output terminal 903 are completely electrically separated from each other, placing output terminal 903 in a high-impedance state.

A signal that is selected and received by tristate receiving circuits 325, 326 is transmitted to functional circuit 310 on second semiconductor chip 303. At the same time, a signal that is received by tristate receiving circuits 306, 323 on second semiconductor chip 303 is transmitted via through-connection 308 and backup through-connection 309 in third semiconductor chip 307, and received by tristate receiving circuits 311, 324 on third semiconductor chip 307 and transmitted to functional circuit 312 thereon. Tristate receiving circuits 311, 324 jointly makeup third switch circuit 211 of the stacked semiconductor device shown in FIG. 3. Tristate receiving circuits 306, 323 have respective output terminals connected in common to an end of through-connection 308 and an end of backup through-connection 309. The other end of through-connection 308 is connected to an input terminal of tristate receiving circuit 311, and the other end of through-connection 309 is connected to an input terminal of tristate receiving circuit 324.

Conversely, a signal from third semiconductor chip 307 which transmitted through second semiconductor chip 303 to first semiconductor chip 301 is transmitted from functional circuit 313 on third semiconductor chip 307 via transmitting circuit 314 thereon, through-connections 316, 320, backup through-connections 317, 321, and tristate receiving circuits 315, 319, 322 to first semiconductor chip 301. Second semiconductor chip 303 also has transmitting circuit 318, which transmits a signal through tristate receiving circuit 319 and through-connection 320 to first semiconductor chip 301.

Figure 6:
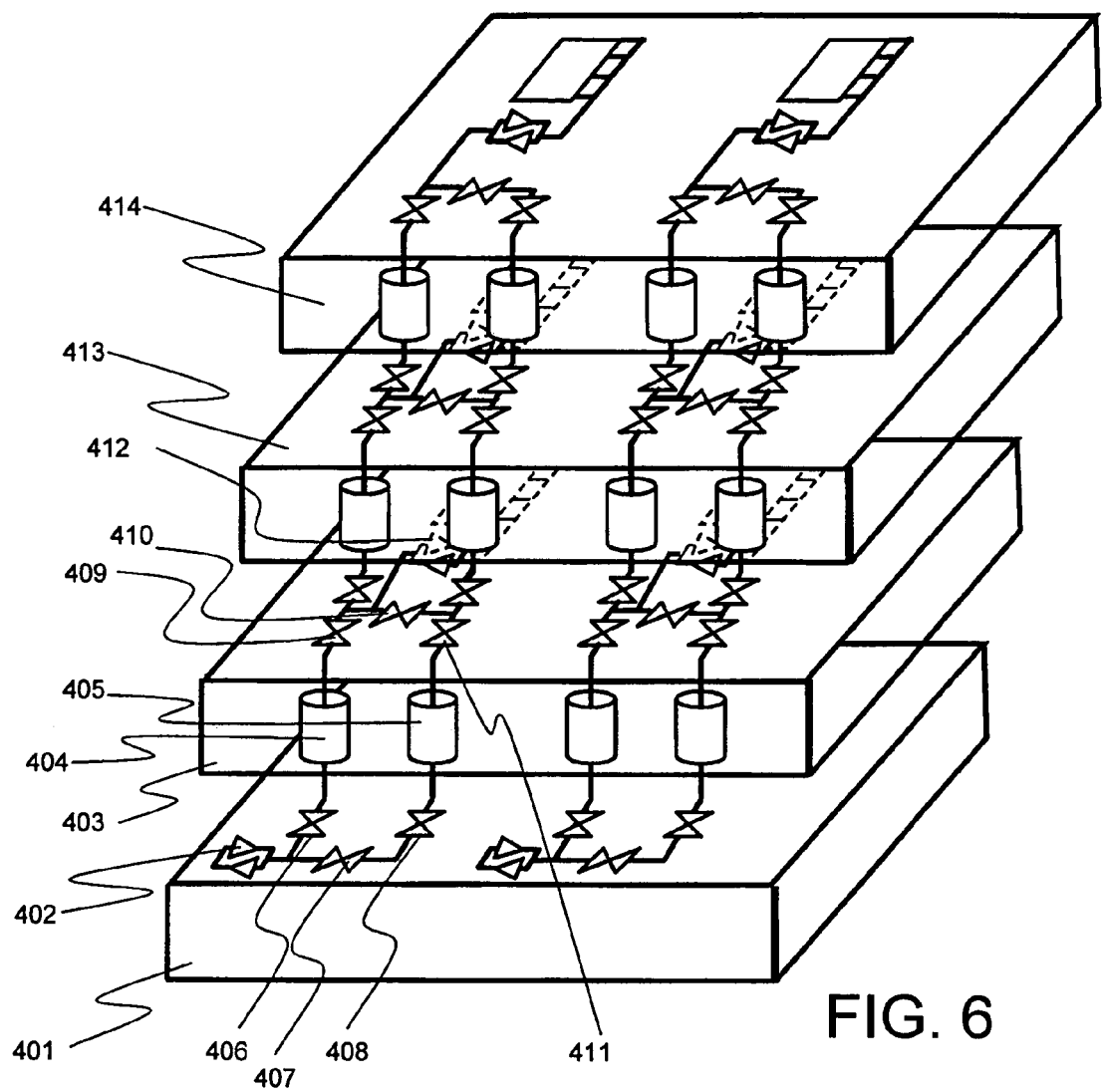
FIG. 6 is a schematic perspective view of a stacked semiconductor device in which a signal is transmitted bidirectionally via through-connections.

FIG. 6 shows a stacked semiconductor device in which a signal is transmitted bidirectionally via through-connections, based on the structure wherein a faulty through-connection is separated by switch circuits as shown in FIG. 3. As shown in FIG. 6, the stacked semiconductor device has four semiconductor chips 401, 403, 413, 414. Second semiconductor chip 403, third semiconductor chip 413, and fourth semiconductor chip 414 are stacked, successively in the order named, on first semiconductor chip 401. In FIG. 6, four semiconductor chips 401, 403, 413, 414 are also shown as being positionally staggered with respect to each other. Actually, however, semiconductor chips 401, 403, 413, 414 are stacked in vertical alignment with each other.

A signal is transmitted between first semiconductor chip 401 and second semiconductor chip 403 through first bidirectional transceiver circuit 402 on first semiconductor chip 401, tristate switch circuits 406, 407, 408 on first semiconductor chip 401, through-connection 404 and backup through-connection 405 in second semiconductor chip 403, tristate switch circuits 409, 410, 411 on second semiconductor chip 403, and second bidirectional transceiver circuit 412 on second semiconductor chip 403. First bidirectional transceiver circuit 402 has a transmitting and receiving terminal connected through tristate switch circuit 406, through-connection 404, and tristate switch circuit 409 to second bidirectional transceiver circuit 412. A series-connected circuit made up of tristate switch circuit 406, through-connection 404, and tristate switch circuit 409 is connected parallel to a series-connected circuit made up of tristate switch circuits 407, 408, backup through-connection 405, and tristate switch circuits 411, 410 which are connected in the order named.

Likewise, signals are transmitted between all four semiconductor chips 401, 403, 413, 414, e.g., between second semiconductor chip 403 and third semiconductor chip, 413 and between third semiconductor chip 413 and fourth semiconductor chip 414, through bidirectional transceiver circuits, through-connections and backup through-connections, and tristate switch circuits connected thereto. According to the embodiment shown in FIG. 6, a faulty through-connection can be completely electrically separated by tristate switch circuits connected to the opposite ends of the faulty through-connection. Therefore, semiconductor chips remain electrically connected regardless of the fault mode of the faulty through-connection, e.g., an opening failure or a short-circuiting failure.

A faulty through-connection can be detected by monitoring the amount of current flowing through the through-connection or monitoring the transfer speed at which a signal that can be transmitted between through-connections is transferred.

Figure 7:
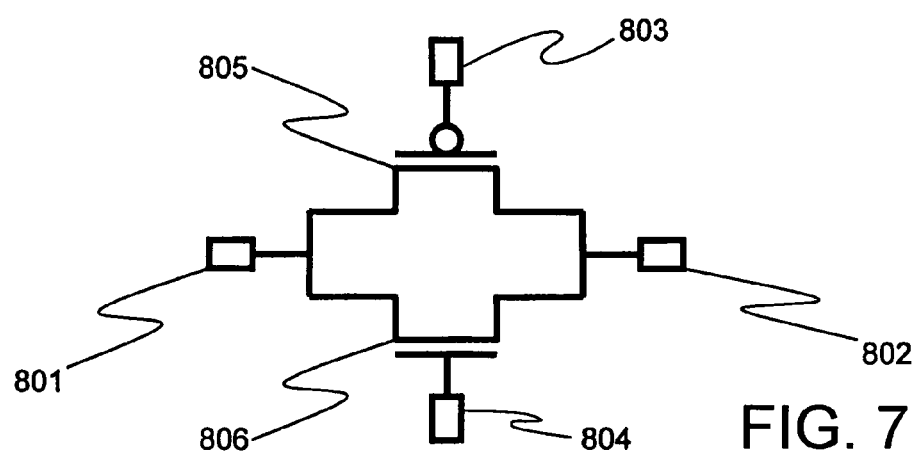
FIG. 7 is a circuit diagram of an example of a tristate switch circuit.

FIG. 7 shows an example of each of the tristate receiving circuits of the stacked semiconductor device shown in FIG. 6. As shown in FIG. 7, the tristate receiving circuit has PMOS transistor 805 and NMOS transistor 806 which have respective channels connected parallel to each other. The connected channels have opposite terminals serving as two input/output terminals 801, 802. Transistor 805 and transistor 806 have respective gates connected respectively to control terminals 803, 804. The tristate receiving circuit is capable of completely electrically separating two input/output terminals 801, 802 from each other depending on the state of control terminals 803, 804.

Certain arrangements for increasing the redundancy of through-connections by using backup through-connections connected parallel to the through-connections are described above with reference to FIGS. 2, 3, 4, and 6. In these arrangements, backup through-connections for redundancy are connected to a single signal line provided by through-connections. The plural through-connections are effective to reduce the fraction defective of stacked semiconductor devices.

In the structure where switch circuits are connected to the opposite ends of a through-connection and the through-connection is completely electrically separated by the switch circuits when necessary, each primary through-connection does not need to be associated with a backup through-connection, and a plurality of primary faulty through-connections may share one or more backup through-connections.

Figure 8:
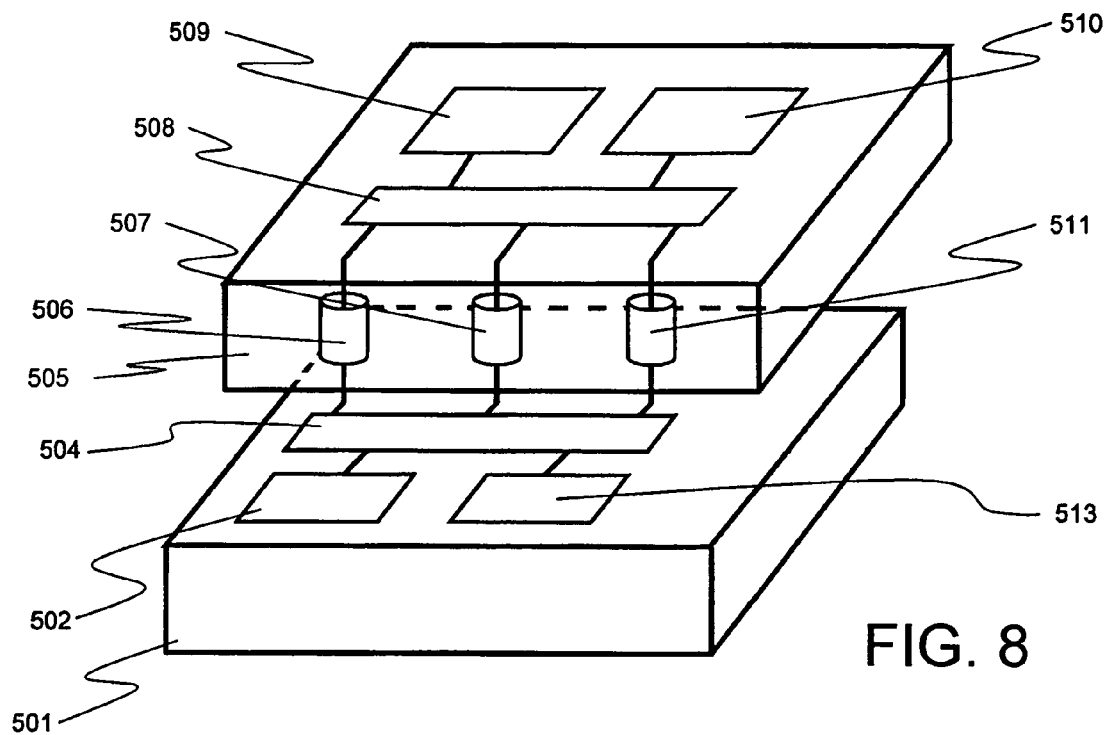
FIG. 8 is a schematic perspective view of a stacked semiconductor device in which a backup through-connection is shared by a plurality of through-connections.

FIG. 8 shows a stacked semiconductor device in which two through-connections are used to transmit different signals, and a backup through-connection is shared by those two through-connections. In FIG. 8, the stacked semiconductor device has first semiconductor chip 501 and second semiconductor chip 505 stacked thereon. However, the stacked semiconductor device may have three or more semiconductor chips.

Functional circuits 502, 513 are disposed on first semiconductor chip 501, and functional circuits 509, 510 disposed on second semiconductor chip 505. Through-connection 506 for interconnecting functional circuits 502, 509, through-connection 511 for interconnecting functional circuits 513, 150, and backup through-connection 507 shared by through-connections 506, 511 extend through second semiconductor chip 505. First semiconductor chip 501 has first switch circuit 504 for connecting the signal path from functional circuit 502 selectively to through-connection 506 and backup through-connection 507 and also for connecting the signal path from functional circuit 513 selectively to through-connection 511 and backup through-connection 507. Similarly, second semiconductor chip 505 has second switch circuit 508 for connecting the signal path to functional circuit 509 selectively to through-connection 506 and backup through-connection 507 and also for connecting the signal path to functional circuit 510 selectively to through-connection 511 and backup through-connection 507.

If the through-connections are normal, then first functional circuit 502 on first semiconductor chip 501 and second functional circuit 509 on second semiconductor chip 505 are connected to each other via first switch circuit 504, through-connection 506, and second switch circuit 508. Similarly, functional circuit 513 and functional circuit 510 are connected to each other via first switch circuit 504, through-connection 511, and second switch circuit 508.

The arrangement shown in FIG. 8 resides in that backup through-connection 507 is shared by two through-connections 506, 511. That is, backup through-connection 507 is used commonly in the event of a fault of through-connection 506 or in the event of a fault of through-connection 511. Specifically, in the event of such a fault, the signal path through the faulty through-connection is changed to the signal path through backup through-connection 507 by switch circuits 504, 508, and the faulty through-connection is electrically separated.

Since the backup through-connection is shared by the two through-connections, if the two through-connections fail simultaneously, then the two connection failures cannot simultaneously be avoided. However, if either one of the two through-connections fails, then the connection failure can be eliminated. Furthermore, even if the two through-connections fail, the backup through-connection may be selected to replace the two through-connections at different times for thereby providing two signal paths.

With a plurality of through-connections sharing a single backup through-connection, it is possible to reduce the total number of backup through-connections with respect to the total number of through-connections used in a stacked semiconductor device (or a semiconductor chip) and also to efficiently relieve through-connection failures.

Figure 9:
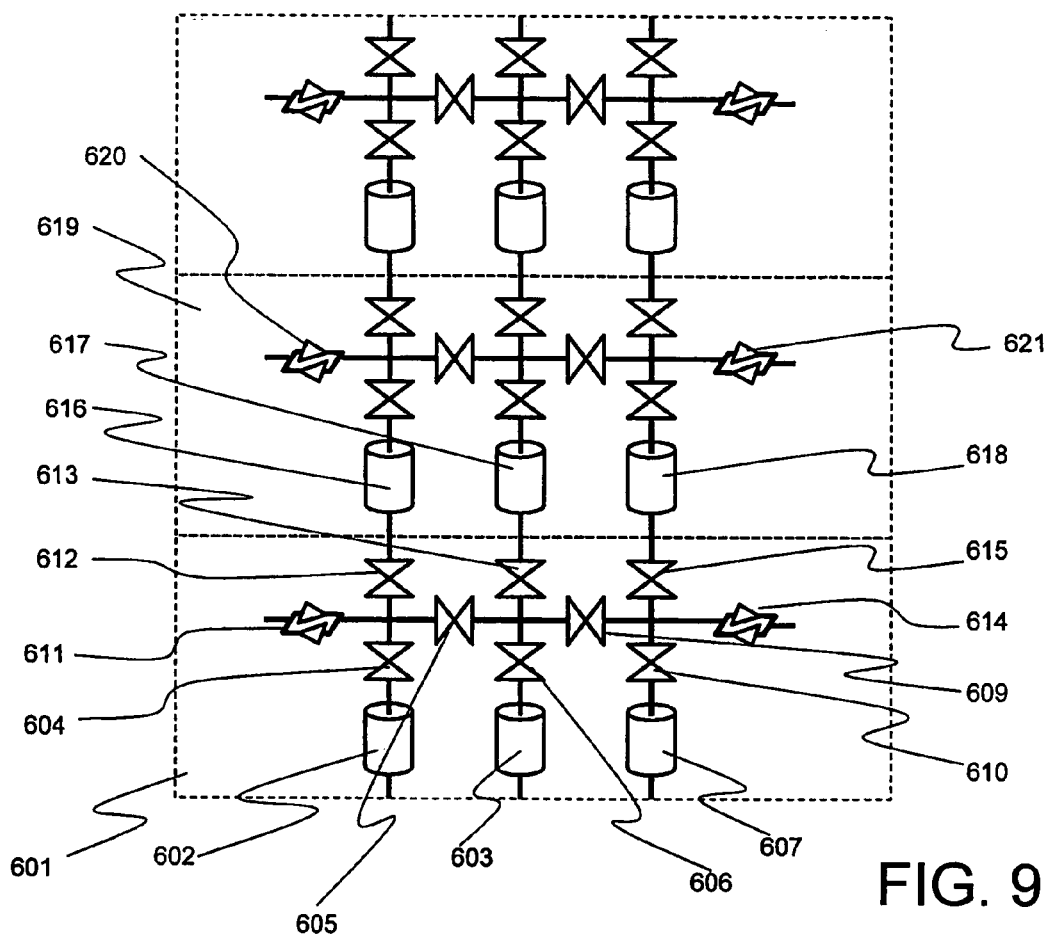
FIG. 9 is a schematic view of a stacked semiconductor device in which a backup through-connection is shared by a plurality of through-connections and a signal is transmitted bidirectionally via through-connections.

FIG. 9 shows a specific layout of switch circuits in a stacked semiconductor device where a backup through-connection is shared by a plurality of through-connections. Regions surrounded by the dotted lines in FIG. 9 represent semiconductor chips.

As shown in FIG. 9, first semiconductor chip 601 has two through-connections 602, 607 and one backup through-connection 603. Second semiconductor chip 619 has two through-connections 616, 618 and one backup through-connection 617. A third semiconductor chip has two through-connections and one backup through-connection. Tristate switch circuits are connected to the opposite ends of these through-connections and backup through-connections. Depending on a fault of through-connections and backup through-connections, the tristate switch circuits are controlled to interconnect transceiver circuit 611 on first semiconductor chip 601 and transceiver circuit 620 on second semiconductor chip 619. Similarly, transceiver circuit 614 on first semiconductor chip 601 and transceiver circuit 621 on second semiconductor chip 619 can be interconnected when the tristate switch circuits are controlled depending on a fault of through-connections and backup through-connections. Each of the tristate switch circuits may be of the structure shown in FIG. 7.

A primary signal path between transceiver circuits 611, 620 is provided by through-connection 616, and a primary signal path between transceiver circuits 614, 621 is provided by through-connection 618. Through-connection 602 has an upper end, as shown, connected to the lower end of through-connection 616 through tristate switch circuits 604, 612. The junction between tristate switch circuits 604, 612 is connected to a transmitting and receiving terminal of transceiver circuit 611 and a terminal of tristate switch circuit 605. Likewise, through-connection 607 has an upper end, as shown, connected to the lower end of through-connection 618 through tristate switch circuits 610, 615. The junction between tristate switch circuits 610, 615 is connected to a transmitting and receiving terminal of transceiver circuit 614 and a terminal of tristate switch circuit 609. Backup through-connection 603 has an upper end, as shown, connected to the lower end of backup through-connection 617 through tristate switch circuits 606, 613, and the junction between tristate switch circuits 606, 613 is connected to the other terminal of tristate switch circuit 605 and the other terminal of tristate switch circuit 609.

Figure 10:
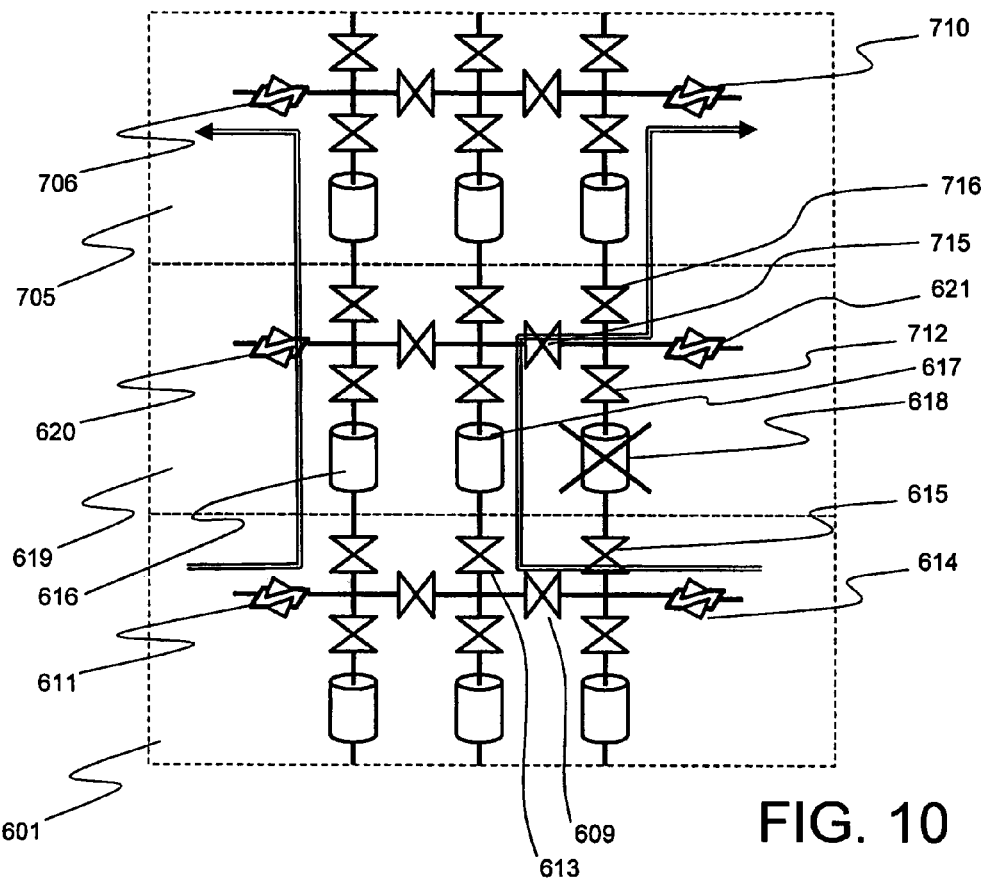
FIG. 10 is a schematic view exemplarily showing signal paths in the stacked semiconductor device shown in FIG. 9.

FIG. 10 shows specific signal paths in the stacked semiconductor device shown in FIG. 9. If through-connection 618 in second semiconductor chip 619 fails, then switch elements 615, 712 are used to separate through-connection 618 and switch elements 609, 613, 715, 716 are used to change the signal path to backup through-connection 617. In this manner, an electric connection is provided between transceiver circuit 614 on first semiconductor chip 610 and transceiver circuit 710 on third semiconductor chip 705, as indicated by the arrow, irrespective of the failure of through-connection 618. Since through-connection 616 is normal, an electric connection is provided between transceiver circuit 611 on first semiconductor chip 610 and transceiver circuit 706 on third semiconductor chip 705, via through-connection 616.

The circuit systems for switching between the through-connections and the backup through-connections have been described above. Examples of layouts of backup through-connections in semiconductor chips will be described below.

Figure 11:
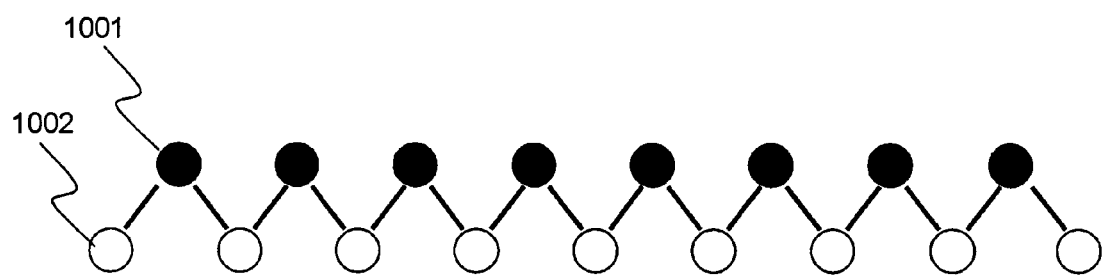
FIG. 11 is a view showing an example of a layout of through-connections and backup through-connections, with each of the through-connections sharing two backup through-connections.

FIG. 11 shows a layout of through-connections and backup through-connections, with each of the through-connections sharing two backup through-connections. Through-connections 1001 and backup through-connections 1002 are disposed in the plane of a semiconductor chip. In FIGS. 11 to 18, solid circles represent the positions of through-connections, and blank circles represent the positions of backup through-connections. Backup through-connections that can be used in place of through-connections are indicated by being joined to those through-connections by solid lines.

In the layout shown in FIG. 11, a plurality of through-connections 1001 are arranged in line, and a plurality of backup through-connections 1002, whose number is one more than the number of through-connections 1001, are also arranged in line parallel to the array of through-connections 1001 at the same spaced intervals as those of through-connections 1001. Backup through-connections 1002 are arranged such that one backup through-connection 1002 is located at a position corresponding to a position intermediate between two adjacent through-connections 1001. According to this layout, the distances between each through-connection 1001 and two backup through-connections 1002 associated with through-connection 1001 are equal to each other. Since the distances between each through-connection 1001 and two backup through-connections 1002 associated with through-connection 1001 are equal to each other, when the signal path is switched from through-connection 1001 to one of backup through-connections 1002, the delay time of a signal passing through backup through-connection 1002 is equal to the delay time of the signal passing through primary through-connection 1001. Accordingly, when the signal path is switched from through-connection 1001 to one of backup through-connections 1002, it is not necessary to adjust the signal delay time, and hence it is not necessary to add a delay time control circuit.

Figure 12:
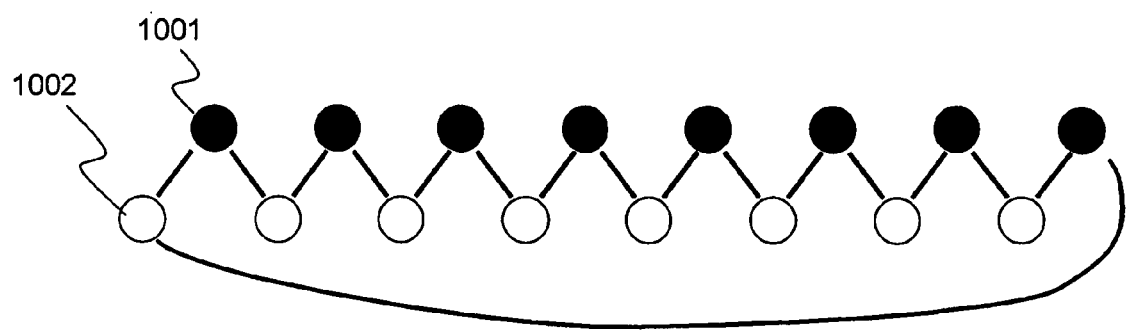
FIG. 12 is a view showing another example of a layout of through-connections and backup through-connections, with each of the through-connections sharing two backup through-connections.

However, according to the layout shown in FIG. 11, each of backup through-connections 1002 positioned at the opposite ends of the array has a redundancy corresponding to one through-connection 1001. Stated otherwise, the available backup through-connections are not effectively utilized. FIG. 12 shows another layout wherein two backup through-connections can selectively be used in place of each through-connection. The layout shown in FIG. 12 is similar to the layout shown in FIG. 11, except that one of the backup through-connections positioned at the opposite ends of the array is dispensed with, and the other of the backup through-connections positioned at the opposite ends of the array can be connected to the through-connection at the other end of the array for making the backup through-connections utilizable efficiently.

Each of the layouts shown in FIGS. 11 and 12 where two backup through-connections can be assigned to each through-connection may employ switch circuits which can reliably switch between connections, as shown in FIG. 9, as switch circuits for switching between through-connections and backup through-connections. The number of switch circuits can be reduced if 3:1 selector switches are used.

Figure 13:
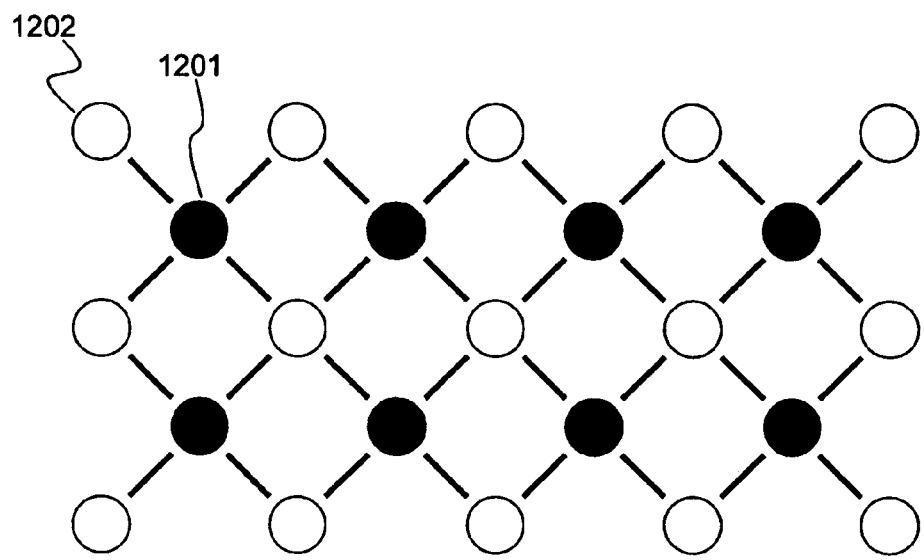
FIG. 13 is a view showing an example of a layout of through-connections and backup through-connections, with each of the through-connections sharing four backup through-connections.

FIG. 13 shows a layout of through-connections and backup through-connections, with each of the through-connections sharing four backup through-connections. As shown in FIG. 13, backup through-connections 1202 are positioned at lattice points of a square lattice, and through-connections 1201 are positioned at the centers of minimum squares of the square lattice. As a result, four backup through-connections 1202 are disposed at respective positions equally spaced from each of through-connections 1201. When a through-connection is switched to one of the four backup through-connections associated therewith, the signal delay time does not change, and hence the signal delay time does not need to be adjusted upon switching from the through-connection to one of the fourth backup through-connections.

Figure 14:
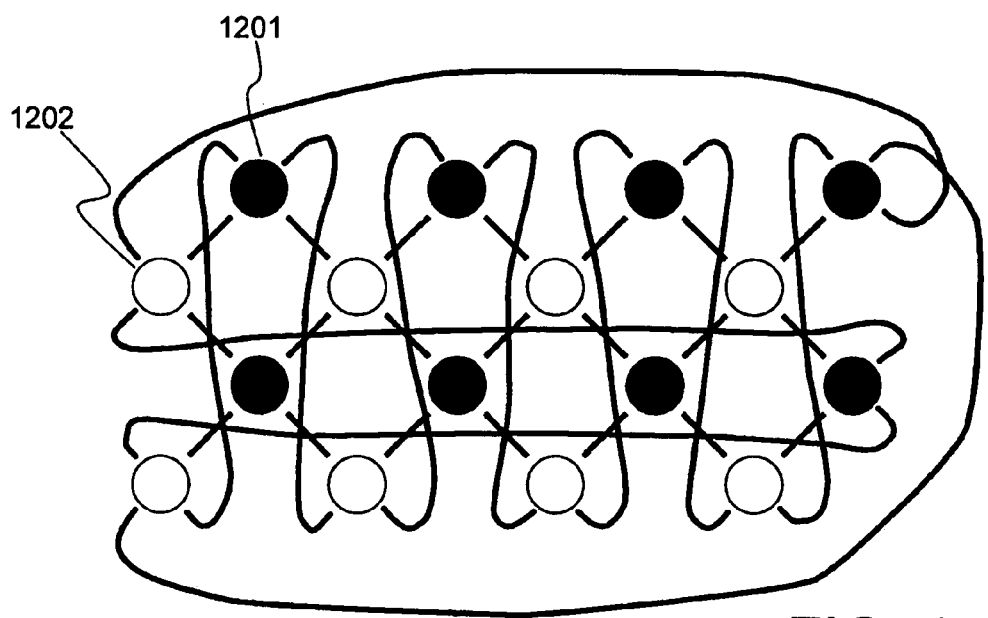
FIG. 14 is a view showing another example of a layout of through-connections and backup through-connections, with each of the through-connections sharing four backup through-connections.

With the layout shown in FIG. 13, however, each of the backup through-connections positioned at outer edges of the square lattice is only assignable to one or two through-connections. Therefore, the backup through-connections can be utilized with low efficiency. FIG. 14 shows another layout wherein four backup through-connections can selectively be used in place of each through-connection, and backup through-connections on the upper and left sides of the square lattice are dispensed with, and the through-connections on those upper and left sides are assignable to backup through-connections on the other sides for making the backup through-connections utilizable efficiently. As with the layout shown in FIG. 12, the number of through-connections and the number of backup through-connections are equalized to each other to utilize the backup through-connections efficiently.

Figure 15:
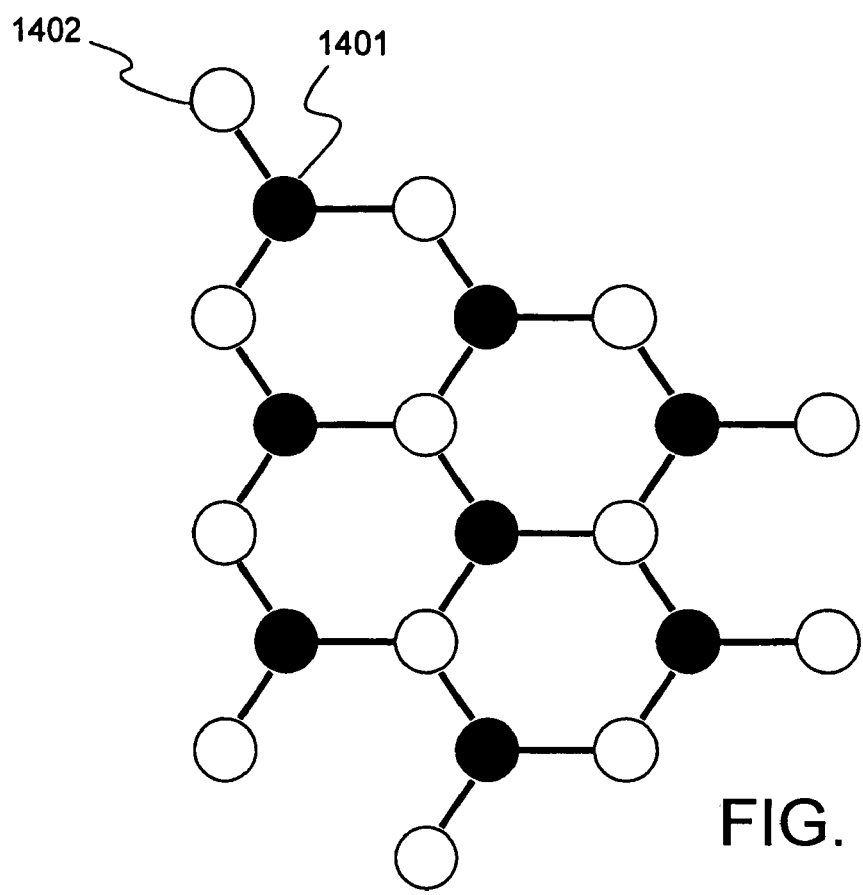
FIG. 15 is a view showing an example of layout of through-connections and backup through-connections, with each of the through-connections sharing three backup through-connections.

FIG. 15 shows a layout of through-connections and backup through-connections, with each of the through-connections sharing three backup through-connections. As shown in FIG. 15, through-connections 1401 and backup through-connections 1402 are alternately positioned at grid points of a hexagonal lattice made up of regular hexagons. Three backup through-connections 1402 are disposed at respective positions equally spaced from each through-connection 1401 surrounded thereby. When through-connection 1401 is switched to one of backup through-connections 1402, the delay time of a signal passing through backup through-connection 1402 is equal to the delay time of the signal passing through primary faulty through-connection 1401. Accordingly, it is not necessary to adjust the signal delay time upon switching from through-connection 1401 backup through-connection 1402.

Figure 16:
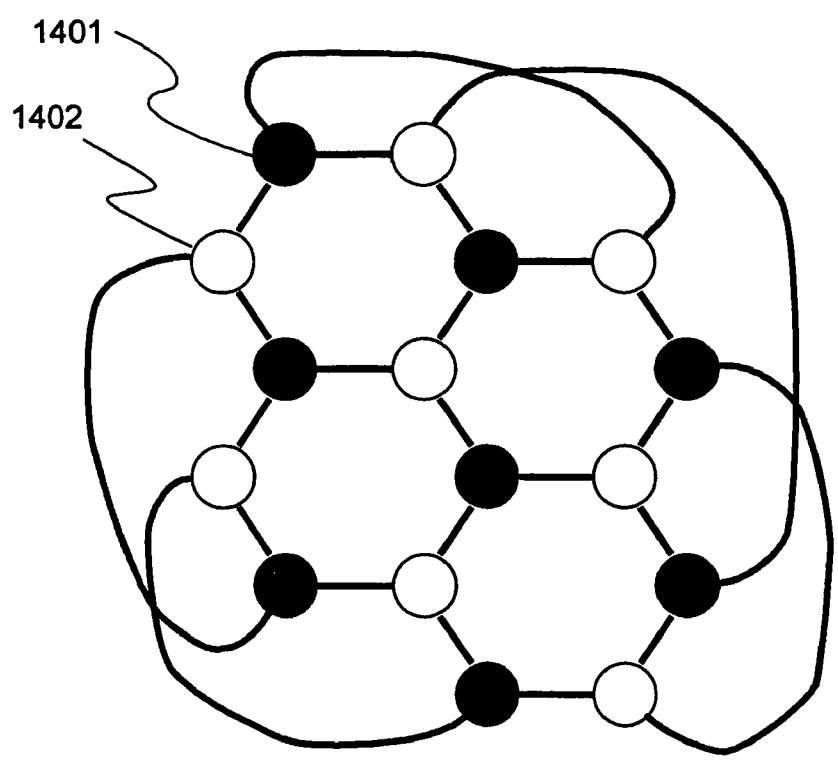
FIG. 16 is a view showing another example of layout of through-connections and backup through-connections, with each of the through-connections sharing three backup through-connections.

With the layout shown in FIG. 15, however, each of the backup through-connections positioned at outer edges of the hexagonal lattice is only assignable to one or two through-connections. Therefore, the backup through-connections can be utilized with low efficiency. FIG. 16 shows another layout wherein three backup through-connections can selectively be used in place of each through-connection, and backup through-connections on the outer sides of the hexagonal lattice are dispensed with, and the through-connections on those sides are assignable to every other backup through-connections for making the backup through-connections utilizable efficiently. As with the layout shown in FIG. 12, the number of through-connections and the number of backup through-connections are equalized to each other to utilize the backup through-connections efficiently.

As described above, when the efficiency with which backup through-connections are utilized is increased, the number of necessary backup through-connections can be equal to the number of through-connections irrespective of the number of backup through-connections that can be assigned. The above layouts are thus effective to increase the efficiency with which backup through-connections are utilized while minimizing the number of necessary backup through-connections. Stated otherwise, increasing the efficiency with which backup through-connections are utilized makes it possible to reduce the fraction defective of the stacked semiconductor device due to a failure of through-connections in stacked semiconductor chips.

Figure 17:
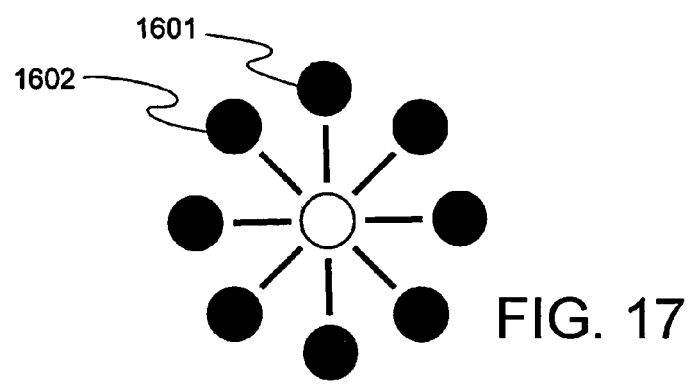
FIG. 17 is a view showing an example of a layout of through-connections and backup through-connections, with eight through-connections sharing one backup through-connection.

FIG. 17 shows a layout of through-connections and backup through-connections, with eight through-connections sharing one backup through-connection. As shown in FIG. 17, eight through-connections 1601 are positioned at the respective vertexes of a regular octagon, and a backup through-connection 1602 is positioned at the center of the regular octagon. Eight through-connections 1601 are disposed at respective positions equally spaced from backup through-connection 1602 surrounded thereby. When one of through-connections 1601 is switched to backup through-connection 1602, the delay time of a signal passing through backup through-connection 1602 is equal to the delay time of the signal passing through primary through-connection 1601. Accordingly, it is not necessary to adjust the signal delay time upon switching from through-connection 1601 backup through-connection 1602.

Figure 18:
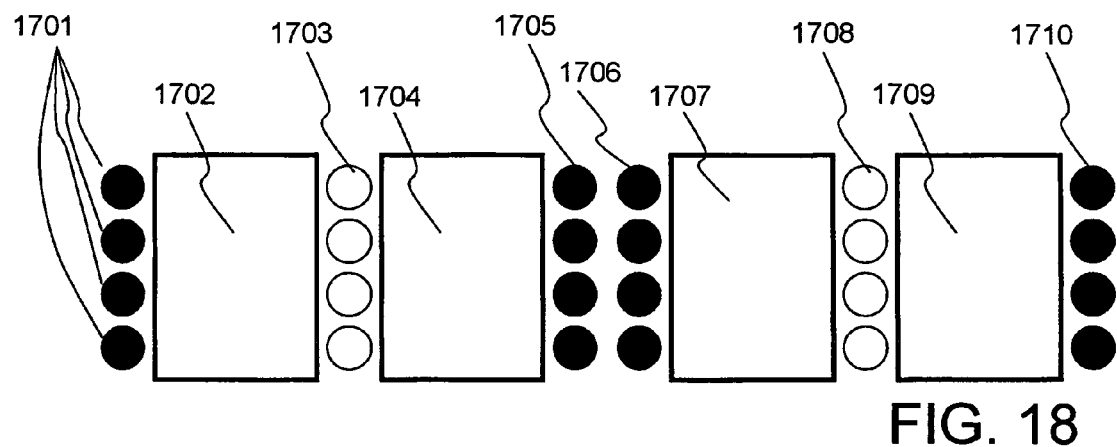
FIG. 18 is a view showing an example of a layout of functional circuits associated with backup through-connections.

FIG. 18 shows a layout of functional circuits associated with backup through-connections, as a semiconductor device according to still another embodiment of the present invention. In the layout shown in FIG. 18, a plurality of signals are transmitted to and from the functional circuits. Four functional circuits 1702, 1704, 1707, 1709 are arrayed in line on a semiconductor chip. Functional circuit 1702 is supplied with four signals via through-connections 1701 disposed on one side of functional circuit 1702 which is remote from functional circuit 1704. Functional circuit 1704 is supplied with four signals via through-connections 1705 disposed between functional circuits 1704, 1707. Functional circuit 1707 is supplied with four signals via through-connections 1706 disposed between functional circuits 1704, 1707. Functional circuit 1709 is supplied with four signals via through-connections 1710 disposed on one side of functional circuit 1709 which is remote from functional circuit 1707. Backup through-connections 1703 are disposed between functional circuits 1702, 1704, and backup through-connections 1708 are disposed between functional circuits 1707, 1709. Backup through-connections 1703 provides a redundancy for through-connections 1701 and through-connections 1705, and backup through-connections 1708 provides a redundancy for through-connections 1706 and through-connections 1710. With the layout shown in FIG. 18, since backup through-connections 1703 are disposed between functional circuits 1702, 1704, connections for supplying signals to functional circuits 1702, 1704 are configured without a waste of layout space. Similarly, backup through-connections 1708 are disposed between functional circuits 1707, 1709, connections for supplying signals to functional circuits 1707, 1709 are configured without a waste of layout space.

While preferred embodiments of the present invention have been described using specific terms, such description is for illustrative purposes only, and it is to be understood that changes and variations may be made without departing from the spirit or scope of the following claims.

What is claimed is:

1. A stacked semiconductor device comprising:
a plurality of semiconductor chips, said semiconductor chips being stacked together; and
a conductive path from a first terminal to a second terminal extending through at least one of said semiconductor chips;
wherein said semiconductor chips are electrically connected by said conductive path, and each conductive path has a plurality of through-connections extending through the at least one semiconductor chip; and
wherein each of the plurality of through-connections is routed through a through-via, said through-via comprising a hole in the at least one semiconductor chip.

2. The device according to claim 1, wherein said through-connections have electrically identical characteristics.

3. The device according to claim 1, wherein said through-connections are connected parallel to each other.

4. The device according to claim 1, further comprising a switch circuit connected to said through-connections for selectively using a normal one of said through-connections as a signal path.

5. The device according to claim 4, wherein said switch circuit separates a faulty one of said through-connections.

6. The device according to claim 4, wherein said switch circuit is associated with each of said semiconductor chips.

7. The device according to claim 4, wherein said switch circuit comprises a tristate circuit.

8. The device according to claim 7, wherein said switch circuit comprises a transfer gate.

9. The stacked semiconductor device according to claim 4, wherein said through-connections include primary faulty through-connections and backup through-connections, each of said primary faulty through-connections being associated with a plurality of said backup through-connections, and wherein said switch circuit switches each of said primary faulty through-connections to either one of said backup through-connections.

10. The stacked semiconductor device according to claim 9, wherein the number of said primary faulty through-connections and the number of said backup through-connections are equal to each other.

11. The stacked semiconductor device according to claim 1, wherein said through-connections include primary faulty through-connections and backup through-connections, each of said backup through-connections being shared by a plurality of said primary faulty through-connections.

12. The stacked semiconductor device according to claim 4, wherein said switch circuit has a function to detect a failure or a performance deterioration of said through-connections.

13. The stacked semiconductor device according to claim 12, wherein said switch circuit separates one of the through-connections whose failure or performance deterioration is detected, and switches to another one of the through-connections.

14. The stacked semiconductor device according to claim 1, wherein said through-connections include primary faulty through-connections and backup through-connections, each of said semiconductor chips having a plurality of functional circuits, said primary faulty through-connections being connected to said functional circuits, each of said backup through-connections being associated with and shared by at least two of said primary connections.

15. The stacked semiconductor device according to claim 14, wherein each of said backup through-connections is disposed between said functional circuits to which said primary connections sharing said backup through-connection are connected.

* * * * *